(12) United States Patent
Imbornone et al.

(10) Patent No.: US 6,380,821 B1
(45) Date of Patent: Apr. 30, 2002

(54) SUBSTRATE SHIELDED MULTILAYER BALUN TRANSFORMER

(75) Inventors: James F. Imbornone, Methuen; Jean-Marc Mourant, Groton; Daniel Shkap, Cambridge; Tao Liang, Chelmsford, all of MA (US)

(73) Assignee: International Business Machines Corporation, Armonk, NY (US)

( * ) Notice: Subject to any disclaimer, the term of this patent is extended or adjusted under 35 U.S.C. 154(b) by 40 days.

(21) Appl. No.: 09/645,685

(22) Filed: Aug. 24, 2000

(51) Int. Cl.⁷ .................................................. H03H 7/42
(52) U.S. Cl. ............................ 333/25; 333/26; 336/200
(58) Field of Search ...................... 333/25, 26; 336/200, 336/232

(56) References Cited

U.S. PATENT DOCUMENTS

| | | | |
|---|---|---|---|
| 3,747,114 A | 7/1973 | Shyhalla | 343/795 |
| 3,976,959 A | 8/1976 | Gaspari | 333/26 |
| 3,991,390 A | 11/1976 | Conroy | 333/26 |
| 4,125,810 A | 11/1978 | Pavio | 333/26 |
| 4,330,868 A | 5/1982 | Hallford | 455/327 |
| 4,371,982 A | 2/1983 | Hallford | 455/327 |
| 4,525,720 A | 6/1985 | Corzine et al. | 343/895 |
| 4,686,536 A | 8/1987 | Allcock | 343/700 |
| 4,697,192 A | 9/1987 | Hofer et al. | 343/895 |
| 4,952,895 A | 8/1990 | Quan | 333/121 |
| 5,003,622 A | 3/1991 | Ma et al. | 455/327 |
| 5,025,232 A | 6/1991 | Pavio | 455/327 |
| 5,091,708 A | 2/1992 | Bezjak | 333/26 |
| 5,125,111 A | 6/1992 | Trinh | 333/26 |
| 5,172,082 A | 12/1992 | Livingston et al. | 333/26 |
| 5,191,351 A | 3/1993 | Hofer et al | 343/895 |
| 5,304,959 A | 4/1994 | Wisherd et al. | 333/26 |
| 5,497,137 A * | 3/1996 | Fujiki | 336/200 |
| 5,523,728 A | 6/1996 | McCorkle | 333/128 |
| 5,565,881 A | 10/1996 | Phillips et al. | 343/859 |
| 5,740,528 A | 4/1998 | Drennen | 455/327 |
| 5,781,071 A * | 7/1998 | Kusunoki | 330/269 |
| 5,886,589 A | 3/1999 | Mourant | 333/26 |
| 6,097,273 A * | 3/2000 | Frye et al. | 336/200 |

* cited by examiner

Primary Examiner—Justin P. Bettendorf
Assistant Examiner—Damian Cathey
(74) Attorney, Agent, or Firm—Ratner & Prestia; Joseph P. Abate, Esq.

(57) ABSTRACT

A balun transformer having two series connected transformers with each having a primary loop conductor disposed in a stacked configuration. One portion of each primary loop conductors is in a first layer and these two portions of the two primary loop conductors are connected in series. The second portions of the primary loop conductors are in a second layer that is spaced from the first layer with the secondary loop conductors interlaced with these portions of the primary loop conductors in the second layer.

5 Claims, 6 Drawing Sheets

SUBSTRATE SHIELDED MULTILAYER BALUN TRANSFORMER

TECHNICAL FIELD

The present invention relates, in general, to balun transformers and, in particular, to the construction of balun transformers fabricated as part of an integrated circuit.

BACKGROUND OF THE INVENTION

It is common practice to use differential circuits in highly integrated radio frequency integrated circuits to improve signal-to-noise ratio. Two signals of opposite phase, developed from an input signal supplied from an antenna, are combined by the differential circuit, so that the two signals are added to produce the desired signal, while undesired noise is cancelled.

Frequently, in radio frequency integrated circuits that include such differential circuits, unbalanced components are connected to balanced components. Unbalanced components usually are large and expensive filters, power amplifiers, etc. Making such components balanced, though possible, results in large and costly components.

Power matching requires the use of balanced impedance transformers. Passive versus active balun transformers are used primarily because they do not require additional current. However, passive balun transformers are physically large.

Further, high power differential circuits require low loss balun transformer combiners to be power efficient. The two main loss mechanisms in an on-chip balun transformer are conductor loss and substrate loss. In low impedance systems and at lower radio frequencies, conductor loss dominates. At higher frequencies and, in particular, in high impedance systems, where the balun transformer port impedance is on the order of the substrate impedance, substrate loss dominates.

As the loadline impedance is high in a differential circuit to reduce current consumption, high substrate loss is a problem. This problem can be solved by providing a means to reduce substrate loss.

SUMMARY OF THE INVENTION

It is an objective of the present invention to provide a new and improved balun transformer.

It is another objective of the present invention to provide a new and improved balun transformer fabricated as part of an integrated circuit.

It is a further objective of the present invention to provide a balun transformer fabricated as part of an integrated circuit having reduced substrate loss.

A balun transformer, constructed in accordance with the present invention, includes a first layer having a substantially flat first conductor portion of a first primary loop conductor and a substantially flat first conductor portion of a second primary loop conductor connected in series with the substantially flat first conductor portion of the first primary loop conductor. This balun transformer also includes a second layer spaced from the first layer. The second layer has a substantially flat second conductor portion of the first primary loop conductor having a width less than the width of the substantially flat first conductor portion of the first primary loop conductor and a substantially flat second conductor portion of the second primary loop conductor having a width less than the width of the substantially flat first conductor portion of the second primary loop conductor. The second layer also has a substantially flat first secondary loop conductor interlaced with the substantially flat second conductor portion of the first primary loop conductor and a substantially flat second secondary conductor loop conductor interlaced with the substantially flat second conductor portion of the second primary loop conductor.

BRIEF DESCRIPTION OF THE DRAWINGS

The present invention will be best understood from the following detailed description when read in conjunction with the accompanying drawings.

DETAILED DESCRIPTION OF THE INVENTION

Figure 1:
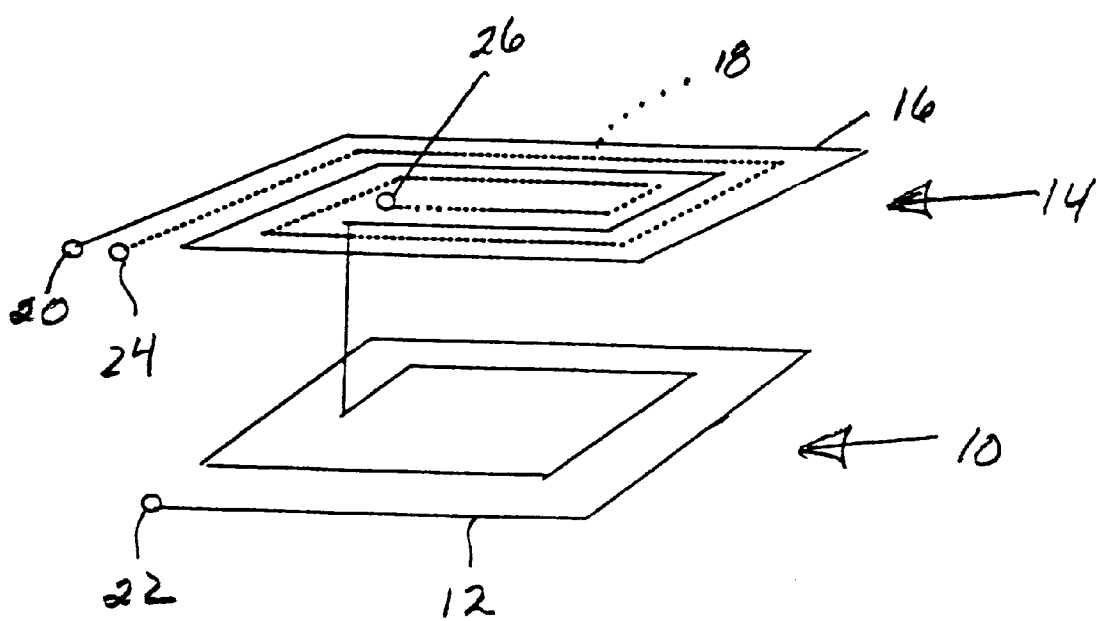
FIG. 1 is a perspective view of one-half of a balun transformer constructed in accordance with the present invention.
Figure 2:
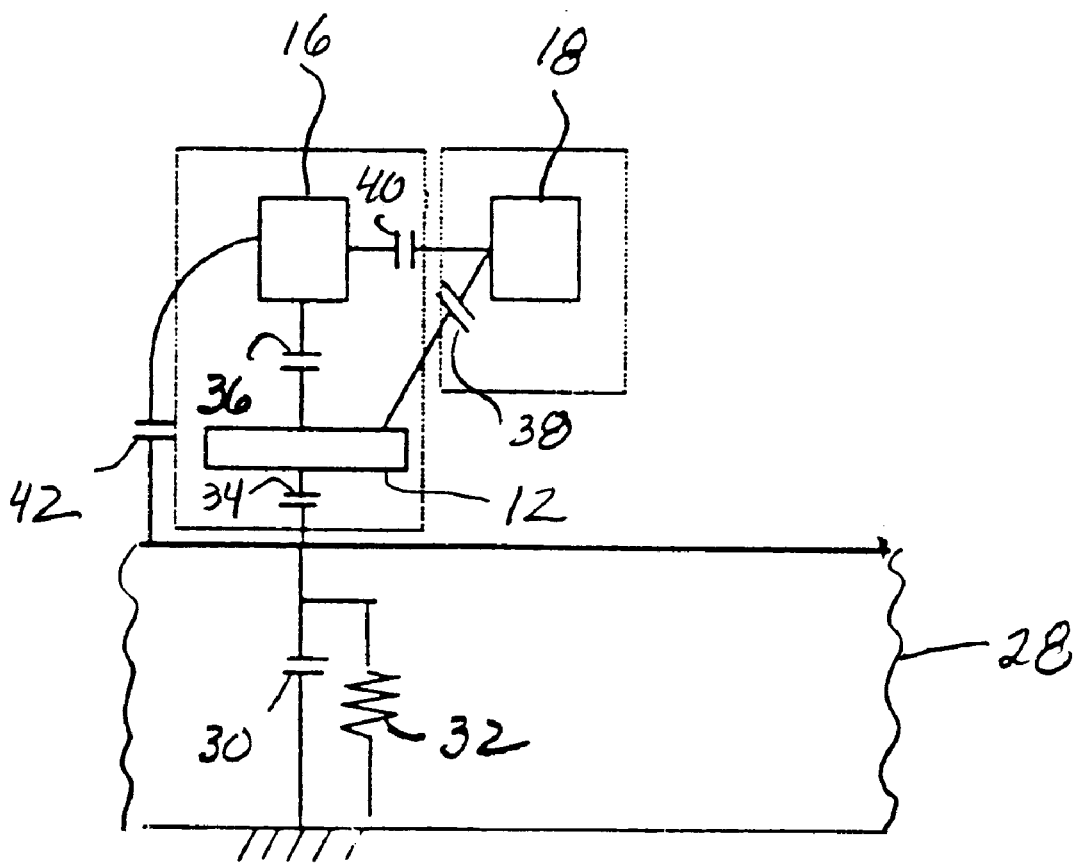
FIG. 2 is a schematic cross-section view of the FIG. 1 balun transformer.
Figure 3:
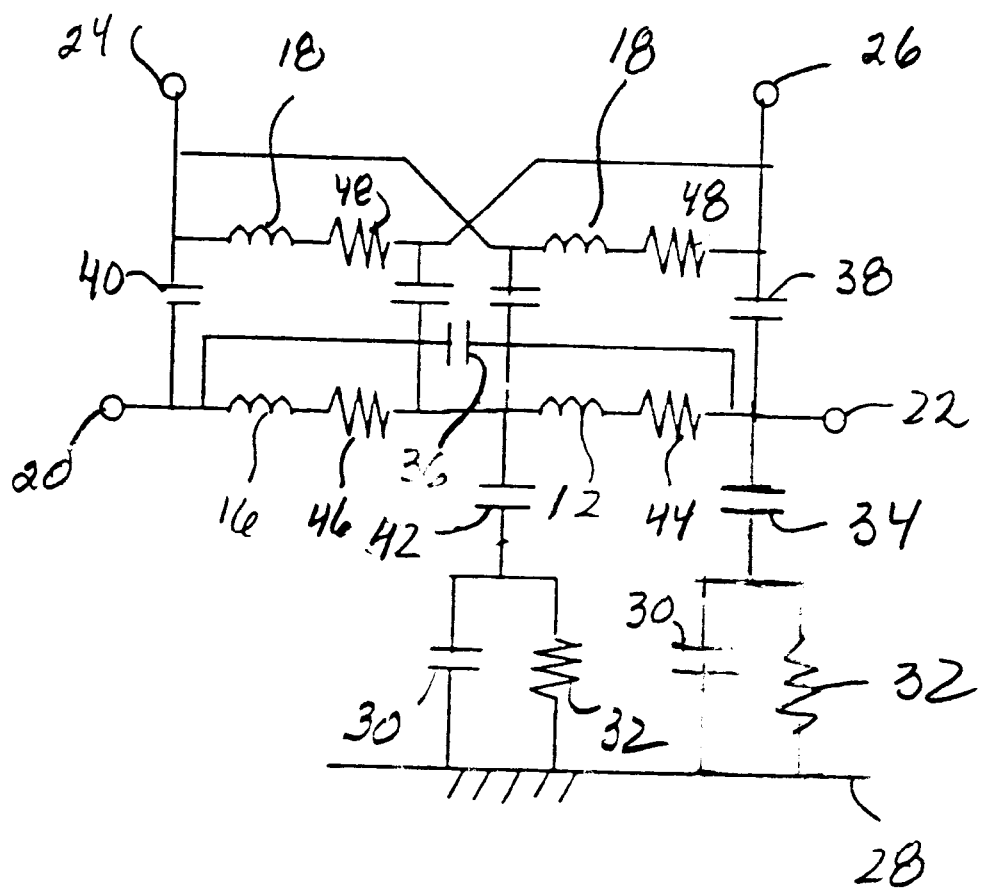
FIG. 3 is a schematic circuit diagram of the FIG. 2 balun transformer.

Referring to FIGS. 1, 2 and 3, a balun transformer, constructed in accordance with the present invention, includes a first layer 10 having a substantially flat first conductor portion 12 of a first primary loop conductor and a second layer 14 spaced from first layer 10 and having a substantially flat second conductor portion 16 of the first primary loop conductor and a substantially flat first secondary loop conductor 18, shown by dotted lines, interlaced with second conductor portion 16 of the first primary loop conductor. The input terminals of the first primary loop conductor are identified by reference numeral 20 and 22 and the output terminals of the first secondary loop conductor 18 are identified by reference numerals 24 and 26. As will be explained in connection with FIGS. 5 and 6, first layer 10 also has a substantially flat first conduct or portion of a second primary loop conductor connected in series with the first conductor portion 12 of the first primary loop conductor and second layer 14 also has a substantially flat second conductor portion of the second primary loop conductor and a substantially flat second secondary loop conductor interlaced with the second conductor portion of the second primary loop conductor.

FIGS. 2 and 3 indicate that a substrate 28, typically a lossy dielectric substrate made from, for example, silicon, on which the balun transformer is formed has a capacitance 30 and a resistance 32. In addition, there is parasitic capacitance 34 between first conductor portion 12 of the first primary loop conductor and substrate 28, parasitic capacitance 36 between first conductor portion 12 of a first primary loop conductor and second conductor portion 16 of the first primary loop conductor, parasitic capacitance 38 between first conductor portion 12 of the first primary loop conductor and first secondary loop conductor 18, parasitic capacitance 40 between second conductor portion 16 of the first primary loop conductor and first secondary loop conductor 18, and parasitic capacitance 42 between second conductor portion 16 of the first primary loop conductor and substrate 28. Resistances 44, 46, and 48 shown in FIG. 3, are the winding resistances of first conductor portion 12 of the first primary loop conductor, second conductor portion 16 of the first primary loop conductor and the first secondary loop conductor 18, respectively.

Figure 4:
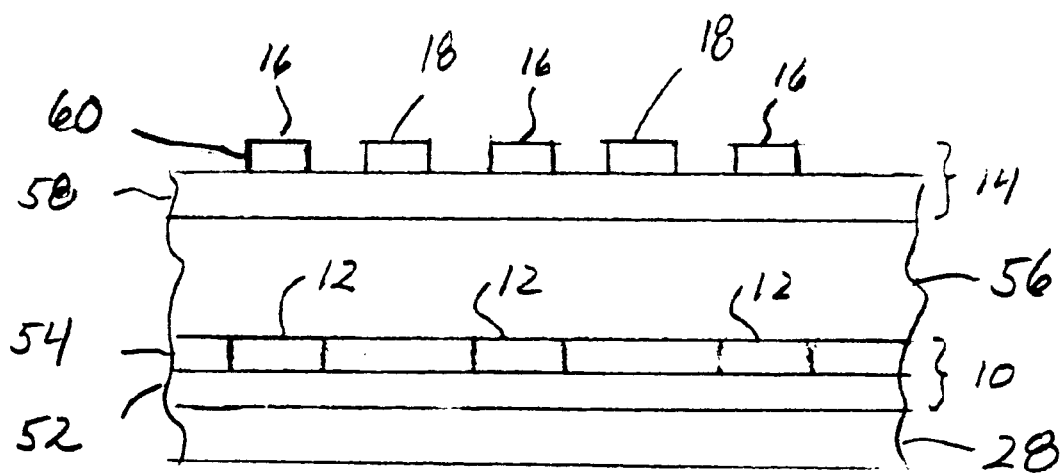
FIG. 4 is a schematic cross-section view of the FIG. 1 balun transformer as part of an integrated circuit.

As shown by FIG. 4, first layer 10 has a first insulation layer 52, made from, for example, silicon dioxide, and a first circuit layer 54 that is positioned over first insulation layer 52 and has the first conductor portion 12 of the first primary loop conductor. As will be explained in connection with FIGS. 5 and 6, first circuit layer 54 also has the first conductor portion of the second primary loop conductor that is connected in series with the first conductor portion 12 of the first primary loop conductor.

A spacer layer 56 is positioned over first circuit layer 54. Spacer layer 56 is made from, for example, silicon dioxide.

Second layer 14 has a second insulation layer 58, made from, for example, silicon dioxide, and positioned over spacer layer 56 and a second circuit layer 60 that is positioned over second insulation layer 58 and has the second conductor portion 16 of the first primary loop conductor. As will be explained in connection with FIGS. 5 and 6, second circuit layer 60 also has the second conductor portion of the second primary loop conductor. As shown in FIG. 4, the width of second conductor portion 16 of the first primary loop conductor is less than the width of first conductor portion 12 of the first primary loop conductor.

Figure 5:
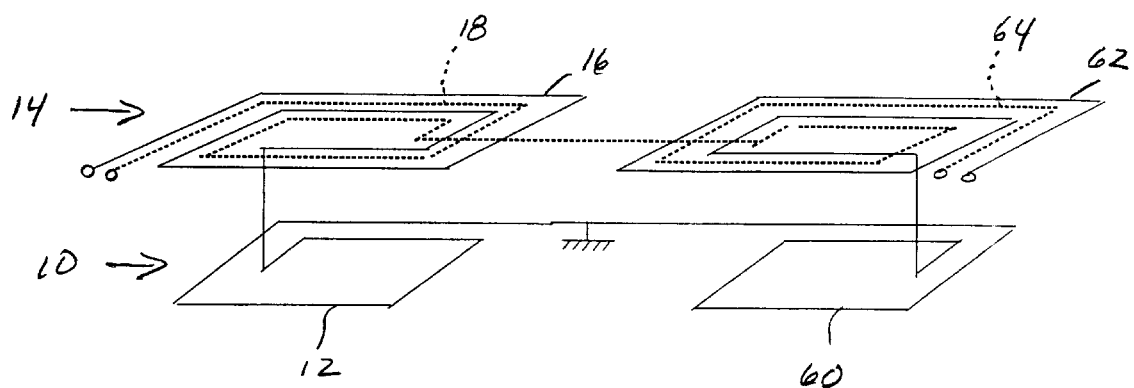
FIG. 5 is a perspective view of a balun transformer constructed in accordance with the present invention.
Figure 6:
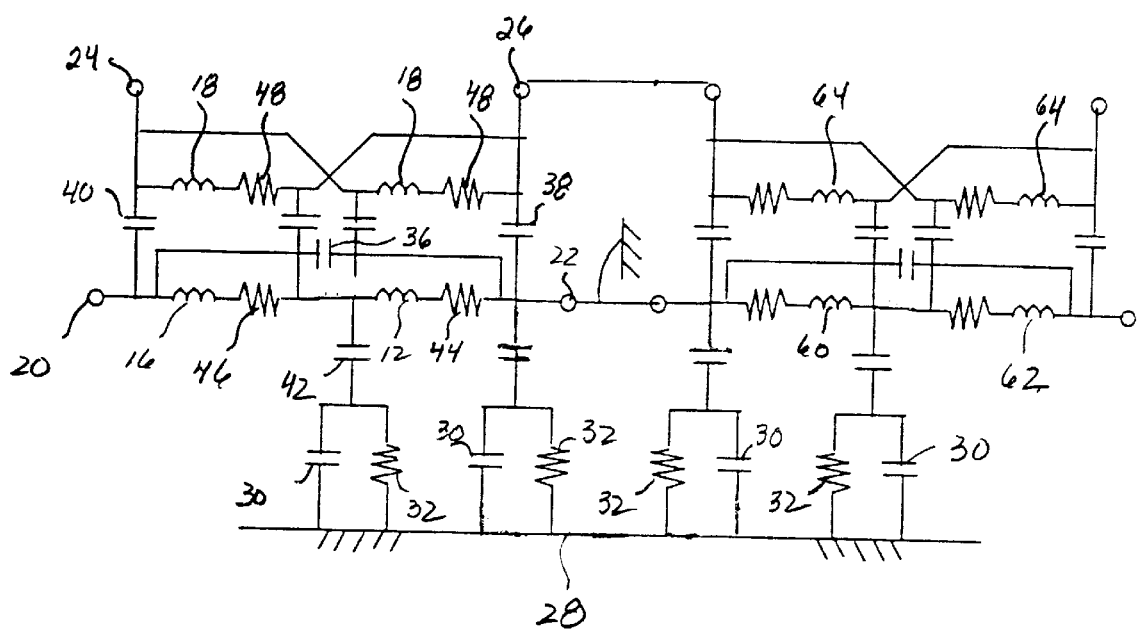
FIG. 6 is a circuit diagram of a balun transformer constructed in accordance with the present invention.

FIGS. 5 and 6 indicate that a balun transformer, constructed in accordance with the present invention, includes a second half balun transformer, identical to the one illustrated in FIG. 1, connected in series with the first balun transformer. In particular, first layer 10 further includes a substantially flat first conductor portion 60 of a second primary loop conductor connected in series with the first conductor portion 12 of the first primary loop conductor with the junction at which first conductor portion 12 of the first primary loop conductor is connected to first conductor portion 60 of the second primary loop conductor grounded. Second layer 14 further includes a substantially flat second conductor portion 62 of the second primary loop conductor and a substantially flat second secondary conductor loop conductor 64 interlaced with second conductor portion 62 of the second primary loop conductor. Second secondary loop conductor 64 is connected in series with first secondary loop conductor 18. As with the first primary loop conductor, the width of second conductor portion 62 of the second primary loop conductor is less than the width of first conductor portion 60 of the second primary loop conductor.

The present invention reduces the substrate loss mechanism, namely the effect of resistances 32 in substrate 28. This is accomplished by the series connection of the two balun transformers to form a single balun transformer. By providing an A-C ground at terminal 22, as shown in FIGS. 5 and 6, the substrate loss is reduced because the parasitics are shorted out. As the loadline impedance is high in a differential circuit to reduce current consumption, a means to reduce substrate loss is required. In accordance with the present invention, a new balun structure is used to "shield" itself from the substrate.

With the ability to design a low loss/high impedance balun at high frequencies (e.g., >1 GHz), this power combining function can be done on-chip. With an on-chip balun, the parasitics can be controlled more easily. Dealing with high transmission line impedances at the board level at high radio frequencies is very difficult due to board parasitic capacitances. Current consumption can be reduced significantly with a low loss monolithic balun constructed in accordance with the present invention.

Although described and illustrated above with reference to certain specific embodiments, the present invention is nevertheless is not intended to be limited to the details shown. Rather, various modifications may be made in the details within the scope and range of equivalents of the claims and without departing from the spirit of the invention.

What is claimed:

1. A balun transformer comprising:
   a first layer having:
      (a) a substantially flat first conductor portion of a first primary loop conductor, and
      (b) a substantially flat first conductor portion of a second primary loop conductor connected in series with said substantially flat first conductor portion of said first primary loop conductor; and
   a second layer spaced from said first layer and having:
      (a) a substantially flat second conductor portion of said first primary loop conductor having a width less than the width of said substantially flat first conductor portion of said first primary loop conductor,
      (b) a substantially flat second conductor portion of said second primary loop conductor having a width less than the width of said substantially flat first conductor portion of said second primary loop conductor,
      (c) a substantially flat first secondary loop conductor interlaced with said substantially flat second conductor portion of said first primary loop conductor, and
      (d) a substantially flat second secondary loop conductor interlaced with said substantially flat second conductor portion of said second primary loop conductor and connected in series with said substantially flat first secondary loop conductor.

2. A balun transformer according to claim 1 wherein:
   (a) said first layer includes:
      (1) a first insulation layer, and
      (2) a first circuit layer position over said first insulation layer and having:
         (i) said substantially flat first conductor portion of a first primary loop conductor, and
         (ii) said substantially flat first conductor portion of a second primary loop conductor connected in series with said substantially flat first conductor portion of said first primary loop conductor;
   (b) said second layer includes:
      (1) a second insulation layer, and
      (2) a second circuit layer positioned over said second insulation layer and having:
         (i) said substantially flat second conductor portion of said first primary loop conductor having a width less than the width of said substantially flat first conductor portion of said first primary loop conductor,
         (ii) said substantially flat second conductor portion of said second primary loop conductor having a width less than the width of said substantially flat first conductor portion of said second primary loop conductor,
         (iii) said substantially flat first secondary loop conductor interlaced with said substantially flat second conductor portion of said first primary loop conductor, and
         (iv) said substantially flat second secondary loop conductor interlaced with said substantially flat second conductor portion of said second primary loop conductor and connected in series with said substantially flat first secondary loop conductor.

3. A balun transformer according to claim 1 wherein the junction at which said first conductor portion of said first primary loop conductor and said first conductor portion of said second primary loop conductor are connected in series is grounded.

4. A balun transformer according to claim 1 wherein the junction at which said first conductor portion of said first primary loop conductor and said first conductor portion of said second primary loop conductor are connected in series is grounded.

5. A balun transformer comprising:

a substrate;

a first insulation layer positioned over said substrate;

a first circuit layer position over said first insulation layer and having:
  (a) a substantially flat first conductor portion of a first primary loop conductor, and
  (b) a substantially flat first conductor portion of a second primary loop conductor connected in series with said substantially flat first conductor portion of said first primary loop conductor;

a spacer layer positioned over said first circuit layer;

a second insulation layer positioned over said spacer layer;

a second circuit layer positioned over said second insulation layer and having:
  (a) a substantially flat second conductor portion of said first primary loop conductor having a width less than the width of said substantially flat first conductor portion of said first primary loop conductor,
  (b) a substantially flat second conductor portion of said second primary loop conductor having a width less than the width of said substantially flat first conductor portion of said second primary loop conductor,
  (c) a substantially flat first secondary loop conductor interlaced with said substantially flat second conductor portion of said first primary loop conductor, and
  (d) a substantially flat second secondary loop conductor interlaced with said substantially flat second conductor portion of said second primary loop conductor and connected in series with said substantially flat first secondary loop conductor.

\* \* \* \* \*